(12) United States Patent
Barash et al.

(10) Patent No.: US 9,059,037 B2
(45) Date of Patent: Jun. 16, 2015

(54) METHODS FOR OVERLAY IMPROVEMENT THROUGH FEED FORWARD CORRECTION

(71) Applicant: GLOBALFOUNDRIES Inc., Grand Cayman (KY)

(72) Inventors: Eugene Barash, Niskayuna, NY (US); Jiejie Xu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 155 days.

(21) Appl. No.: 13/906,955

(22) Filed: May 31, 2013

(65) Prior Publication Data

US 2014/0356982 A1 Dec. 4, 2014

(51) Int. Cl.
*H01L 21/66* (2006.01)
*G03F 7/20* (2006.01)

(52) U.S. Cl.
CPC ............... *H01L 22/12* (2013.01); *H01L 22/20* (2013.01); *G03F 7/70633* (2013.01)

(58) Field of Classification Search
CPC ......... H01L 22/00; H01L 22/12; H01L 22/20; H01L 21/2636; H01L 21/268; G03F 7/70633
USPC .............................. 438/5, 14, 795; 430/22, 30
See application file for complete search history.

(56) References Cited

U.S. PATENT DOCUMENTS

| | | | |
|---|---|---|---|
| 6,560,751 B1 | 5/2003 | Rose | |
| 6,970,757 B1 * | 11/2005 | Hewett et al. | 700/108 |
| 7,349,752 B1 * | 3/2008 | Sturtevant et al. | 700/105 |
| 7,368,208 B1 * | 5/2008 | Adel et al. | 430/22 |
| 7,642,021 B2 * | 1/2010 | Zhang et al. | 430/30 |
| 8,039,181 B2 * | 10/2011 | Seltmann et al. | 430/22 |
| 8,105,736 B2 * | 1/2012 | Yang et al. | 430/22 |
| 8,260,449 B2 * | 9/2012 | Chung | 700/121 |
| 8,288,063 B2 * | 10/2012 | Lu et al. | 430/22 |
| 8,956,885 B2 * | 2/2015 | Barash et al. | 438/5 |
| 2002/0183989 A1 * | 12/2002 | Chien et al. | 703/2 |
| 2009/0248337 A1 * | 10/2009 | Habets et al. | 702/81 |
| 2010/0084744 A1 | 4/2010 | Zafiropoulo et al. | |
| 2012/0146159 A1 * | 6/2012 | Wang et al. | 257/410 |
| 2013/0310966 A1 * | 11/2013 | MacNaughton et al. | 700/121 |
| 2014/0170782 A1 * | 6/2014 | Tsen et al. | 438/14 |

OTHER PUBLICATIONS

O. Fuji et al., "Sophisticated Methodology of Dummy Pattern Generation for Suppressing Dislocation Induced Contact Misalignment on Flash Lamp Annealed eSiGe Wafer", Symposium on VLSI Technology Digest of Technical Papers, pp. 156-157, 2009.
Akio Shima et al., "Dopant Profile Engineering of CMOS Devices Formed by Non-Melt Laser Spike Annealing", Symposium on VLSI Technology Digest of Technical Papers, pp. 144-145, 2005.

* cited by examiner

*Primary Examiner* — Savitr Mulpuri
(74) *Attorney, Agent, or Firm* — Heslin Rothenberg Farley & Mesiti PC

(57) ABSTRACT

Methods and processes for establishing a rework threshold for layers applied after thermal processing during fabrication of semiconductor devices are provided. One method includes, for instance: obtaining a device after at least one laser annealing process is completed, the device including a substrate surface and at least one layer over the substrate surface; performing lithography on the at least one layer; positioning a first contact-to-gate layer over the at least one layer; checking alignment of electrical connections between the substrate surface and the first contact-to-gate layer; determining if an overlay error is present; and adjusting at least one subsequent fabrication process pursuant to the overlay error.

10 Claims, 3 Drawing Sheets

METHODS FOR OVERLAY IMPROVEMENT THROUGH FEED FORWARD CORRECTION

FIELD OF THE INVENTION

The present invention relates to semiconductor devices and methods of fabricating semiconductor devices, and more particularly, to methods and processes for establishing a rework threshold for layers applied after thermal processing.

BACKGROUND OF THE INVENTION

Semiconductor devices may use strained SiGe to reduce short channel effects to improve the device performance. However, SiGe structures are susceptible to strain relaxation causing wafer deformation during thermal annealing. When wafer deformation occurs it leads to stress induced misalignment errors during subsequent lithography processes which ultimately results in substantial yield losses in fabrication of state-of-the-art complementary metal-oxide-semiconductor ("CMOS") devices.

In addition, as devices are increasingly scaled down in size the contact-to-gate overlay requirements become more stringent. When the devices are scaled down the critical layers frequently fail to meet alignment targets due to misalignment of subsequent processing steps and wafer deformation occurring during laser annealing, for example, laser spike annealing ("LSA"). The problem of the critical layers failing to properly align is aggravated by the fact that in-line metrology to quantify LSA-induced warpage is not readily available and becomes apparent only when the wafer fails for overlay at the consecutive lithography ("LIT") step. By the time the wafer reaches the LIT step it is too late to correct the root cause of the misalignment.

This process is problematic for the resultant semiconductor device because layer misalignment and wafer deformation may cause wafers to be unusable. Further, currently used fabrication techniques fail to provide the ability to correct misalignment errors during the application of subsequent layers.

BRIEF SUMMARY

The shortcomings of the prior art are overcome and additional advantages are provided through the provision, in one aspect, of a method which includes, for instance: obtaining a device after at least one laser annealing process is completed, the device including a substrate surface and at least one layer over the substrate surface; performing lithography on the at least one layer; positioning a first contact-to-gate layer over the at least one layer; checking alignment of electrical connections between the substrate surface and the first contact-to-gate layer; determining if an overlay error is present; and adjusting at least one subsequent fabrication process pursuant to the overlay error.

In another aspect, a process is presented which includes, for instance: obtaining a device with a wafer and at least one layer on top of the wafer; performing at least one laser annealing to the at least one layer; applying a mask layer over the at least one layer; performing lithography on the mask layer to form a contact layer; arranging an overlay on top of the contact layer; inspecting the alignment of the contact layer with the overlay; determining an amount of overlay error; and adjusting at least one subsequent process based on the overlay error.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

The present disclosure addresses and enhances, inter alia, the application of layers with a rework threshold after, for example, thermal processing. Thermal processing may include, for example, photolithography or laser annealing, such as laser spike annealing ("LSA"). Laser spike annealing may improve alignment accuracy for critical layers, improve electrical test parametric yield, improve the process capability index, and decrease wafer deformation caused by the laser annealing processes.

Generally stated, disclosed herein are certain novel methods of establishing an overlay correction for layers applied after thermal processing during, for example, middle-of-line ("MOL") processing, which provide significant advantages over the above noted, existing alignment error correction methods. Advantageously, the overlay correction methods disclosed herein may improve the functioning of the electrical circuits after deformation or overlay errors are created and may reduce the number of wafers that are discarded due to misalignment of layers. In addition, the overlay correction methods disclosed herein may remove the need for rework which may, for example, reduce device costs, shorten cycle time, and improve device yield.

During fabrication, a substrate or wafer will be processed through numerous procedures to create the semiconductor device. One such procedure is thermal processing of the substrate, for example, laser spike annealing. The substrate experiences thermal processing in order to activate dopant atoms implanted in regions of the substrate, for example, source and drain regions, with minimal dopant diffusion. The dopants may be used to designate the conductive characteristics of the wafer to either an n-type or p-type silicon. Another such procedure is lithography, for example, photolithography. The substrate is processed using photolithography to transfer patterns or images for the circuit elements of the device onto the wafer using one or more masks.

Figure 1:
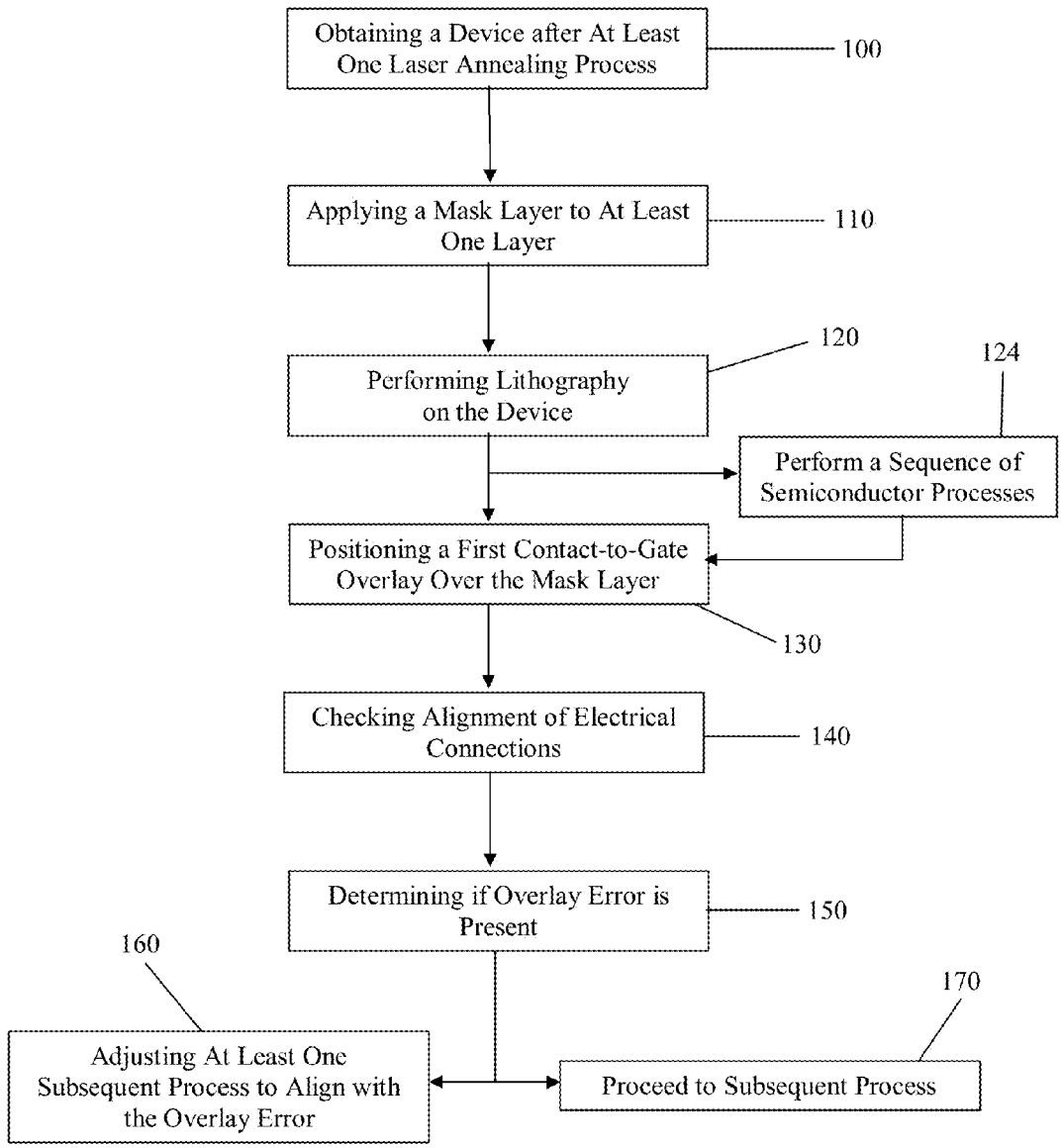
FIG. 1 depicts one embodiment of a portion of a process for establishing a rework threshold for subsequent layers after thermal processing, in accordance with one or more aspects of the present invention.

In one aspect, in one embodiment, as shown in FIG. 1, a portion of the semiconductor device fabrication method or process in accordance with one or more aspects of the present invention may include, obtaining a device after completion of at least one laser annealing process 100, applying a mask layer to the at least one layer 110, performing lithography on the mask layer of the device 120, positioning a first contact-to-gate layer over the mask layer 130, checking alignment of the electrical connections 140, determining if an overlay error is present on the wafer 150, and adjusting at least one subsequent fabrication process to align with the overlay error 160 or proceeding to the subsequent fabrication processing steps 170. In addition, after lithography is performed 120 a sequence of various semiconductor processes may be performed 124, for example, reactive ion etch ("RIE"), diffusion, cleans, etc., to form the desired topography on the wafer surface and/or the desirable dopant profile. The processes performed on the wafer may be selected to obtain a wafer with the desired electrical properties and/or circuit elements, for example, resistors, transistors, capacitors, and connectors. This process is inherent in the more detailed portions of the semiconductor device fabrication process of FIG. 2.

Figure 2:
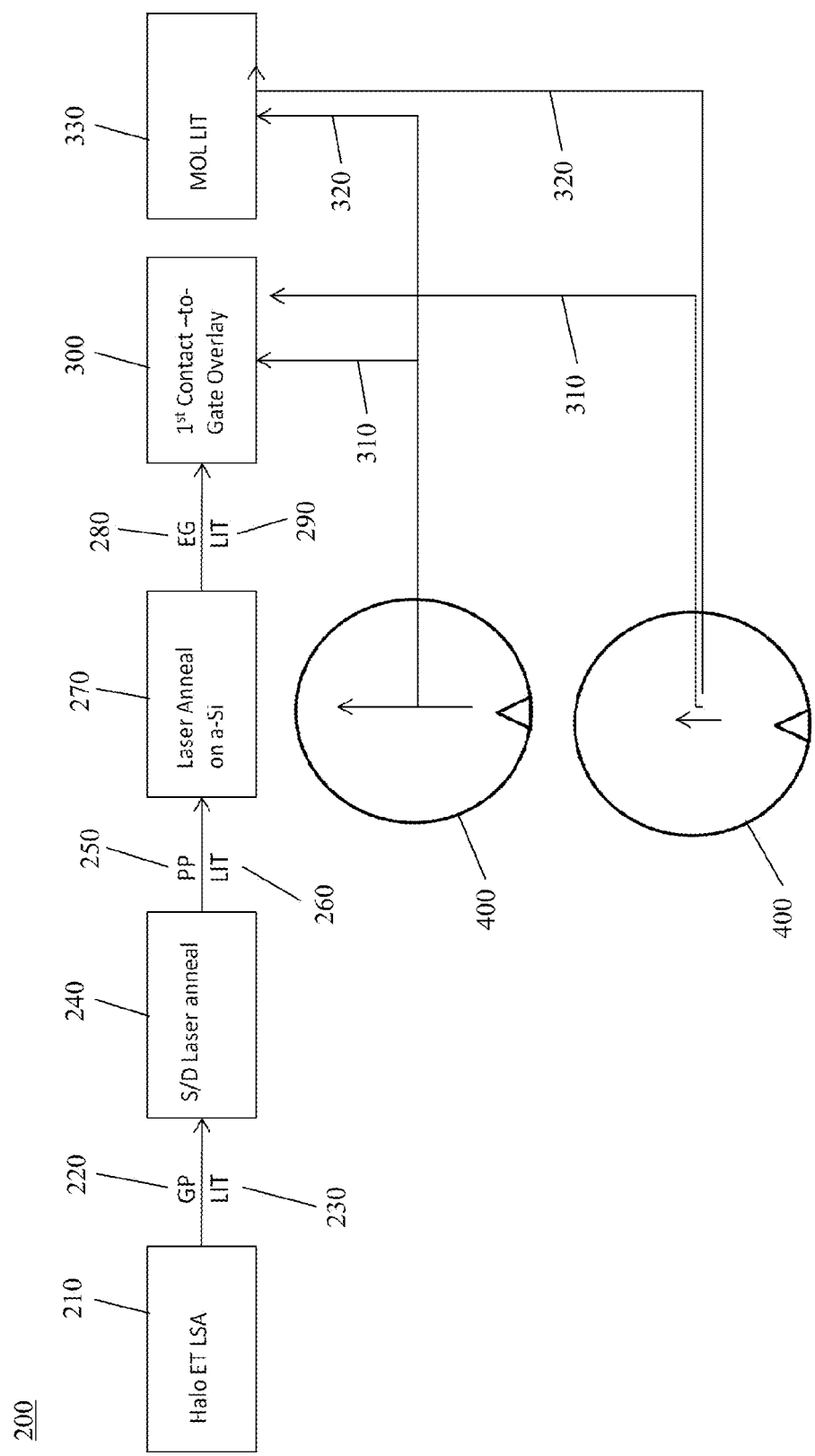
FIG. 2 depicts another embodiment of a portion of the process for fabricating, for instance, establishing a rework threshold for subsequent layers after thermal processing of a semiconductor device, in accordance with one or more aspects of the present invention.

As illustrated in FIG. 2, in an embodiment, a portion of the semiconductor device fabrication process 200 in accordance with one or more aspects of the present invention may include: obtaining a device with at least one layer, laser spike annealing the top layer of the device 210, applying a first mask layer over the top layer 220, performing lithography on the first mask layer 230, laser annealing the source and drain layer 240, applying a second mask layer over the source and drain layer 250, performing lithography on the second mask layer 260, laser annealing an amorphous silicon ("a-Si") layer 270, applying a third mask layer over the a-Si layer 280, performing lithography on the third mask layer 290, positioning a first contact-to-gate layer over the third mask layer 300, determining if an overlay error is present 310, and adjusting at least one subsequent process to align with the overlay error 320. The subsequent processes may be middle-of-the-line processes 330, for example, lithography, etch, diffusion, and the like.

In one embodiment, as shown in FIGS. 1 and 2, lithography may be performed on the mask layers, resulting in the mask layers becoming part of the device. In an alternative embodiment, the mask layers may be removed or stripped from the surface of the device prior to performing the lithography steps. In yet another embodiment, some mask layers may be stripped from the surface of the device prior to lithography while lithography may be performed on other mask layers.

With continued reference to the fabrication processes of FIGS. 1 and 2, as the first contact-to-gate overlay is performed the overlay error that is present in the wafer 400 may be determined. The overlay error may be determined by measuring the amount of misalignment between two adjacent layers of the wafer 400. The misalignment may be measured by determining the offset between two adjacent layers along at least one of a first axis, a second axis that is perpendicular to the first axis, and a third axis that is not orthogonal to the first or second axis. The first axis may be, for example, a longitudinal axis, the second axis may be, for example, a lateral axis, and the third axis may be, for example, a diagonal axis. Once the misalignment is determined the overlay error 310 may be obtained. Then the overlay error 310 may be used to create a rework threshold for at least one subsequent fabrication process. The overlay error 310 in the wafer 400 and the rework threshold may be used to determine an overlay correction. Once the overlay correction is determined at least one subsequent middle-of-the-line process, for example, lithography, may be adjusted to offset the subsequent layers to correspond to the error or misalignment created by the laser annealing processes.

Figure 3:
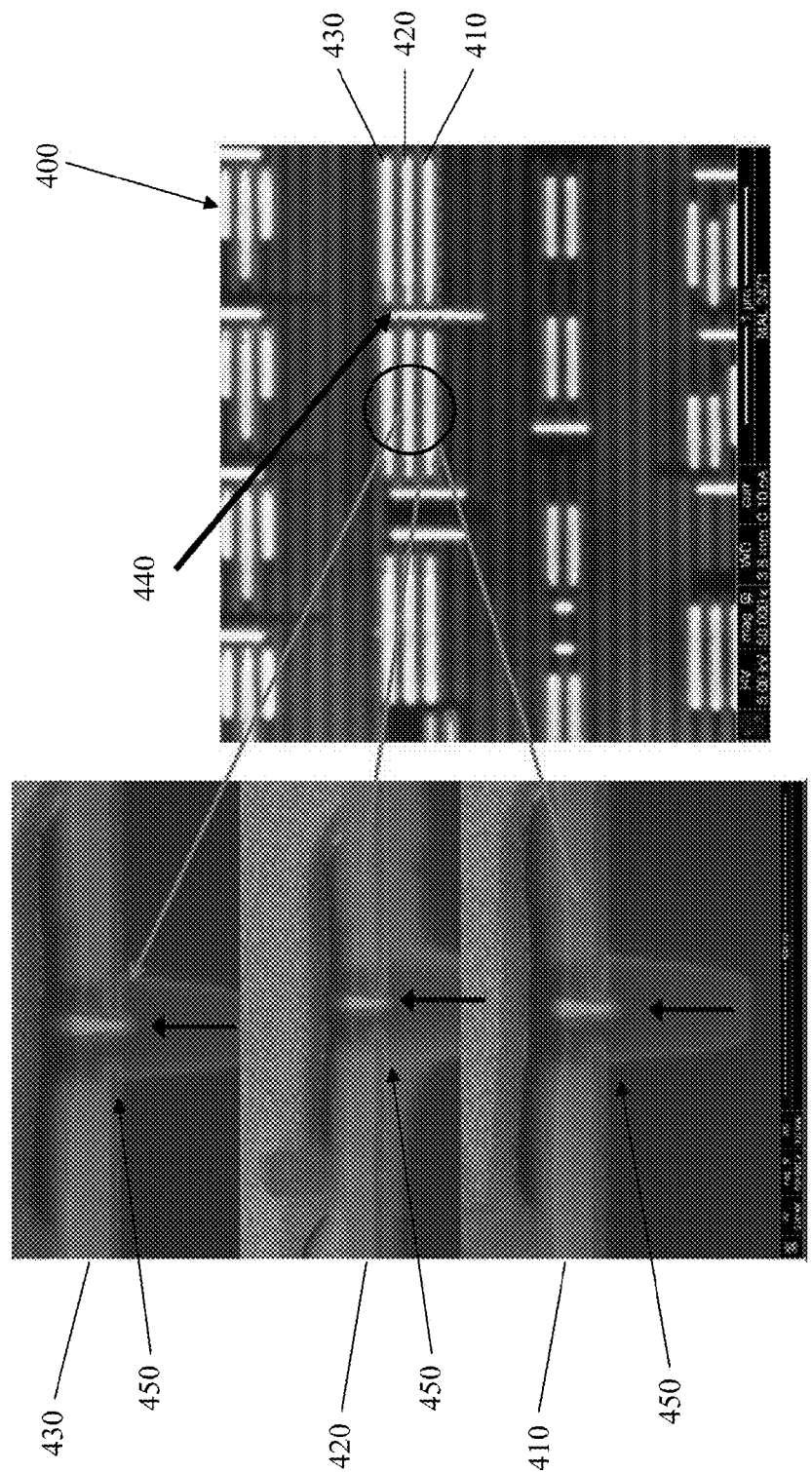
FIG. 3 depicts a scanning electron microscope image of a portion of a wafer after the first contact to gate overlay and a magnified section of the portion of the wafer, in accordance with one or more aspects of the present invention.

By way of specific example, as shown in FIG. 3, the wafer 400 includes a contact 440 which passes through a first layer 410, a second layer 420, and a third layer 430. As shown in the magnified portion of the layers 410, 420, and 430 of FIG. 3, the first and second layers 410, 420 are aligned, but the second and third layers 420, 430 are not aligned. The patterns of the second and third layers 420, 430 are misaligned resulting in, for example, the vias 450 in the second and third layers 420, 430 being misaligned. The misalignment between the second and third layers 420, 430 may be determined by measuring the misalignment of the patterns of each layer 420, 430, for example, by measuring the misalignment of the vias 450 between the layers 420, 430. The misalignment may be determined by measuring the misalignment along, for example, at least one of a longitudinal axis, a lateral axis, and a diagonal axis. The measured misalignment may then be used to determine an overlay error 310. If the overlay error 310 is greater than an acceptable misalignment, then the wafer 400 will be discarded or reworked. If there is no overlay error 310, then the wafer 400 will be passed to the subsequent fabrication processes. However, if the overlay error 310 is less than or equal to an acceptable misalignment, then the wafer 400 may be corrected to enable the resultant semiconductor device to be useable without needing to be reworked. The overlay error 310 will then be used to determine an amount of offset or overlay correction needed to be fed forward for subsequent fabrication processes. In one embodiment, the misalignment amount along at least one of the longitudinal axis, lateral axis, and diagonal axis may be used to offset subsequent fabrication processes in order to align subsequent layers, for example, a fourth layer (not shown) which may be applied onto the third layer 430. The adjustments to subsequent fabrication processes will be based on the type of subsequent fabrication processes being performed and the tools being used to perform those processes. The adjustments may be determined based on transfer function curves created for the equipment or tools being used by, for example, experimentally determining the adjustments needed to correspond with given amounts of misalignment along the longitudinal, lateral, and diagonal axes of the wafer The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
   obtaining a device after at least one laser annealing process is completed, the device including a substrate surface and at least one layer over the substrate surface;
   performing lithography on the at least one layer;
   positioning a first contact-to-gate layer over the at least one layer;
   checking alignment of electrical connections between the substrate surface and the first contact-to-gate layer;
   determining if an overlay error is present;
   adjusting at least one subsequent fabrication process; and
   determining a rework threshold for use in adjusting the at least one subsequent fabrication process;
   wherein the overlay error and the rework threshold are used to determine an overlay correction.

2. The method of claim 1, wherein the overlay error is determined by measuring misalignment between the at least one layer and the first contact-to-gate layer.

3. The method of claim 2, wherein the misalignment is measured along at least one of a first axis, a second axis and a third axis.

4. The method of claim 3, wherein the first axis is a longitudinal axis.

5. The method of claim 4, wherein the second axis is a lateral axis.

6. The method of claim 5, wherein the third axis is a diagonal axis.

7. The method of claim 1, wherein the at least one subsequent process is lithography.

8. The method of claim 1, wherein the overlay correction is used to adjust the at least one subsequent fabrication process.

9. A process, comprising:
   obtaining a device with a wafer and at least one layer on top of the wafer;
   performing at least one laser annealing to the at least one layer;
   applying a mask layer over the at least one layer;
   performing lithography on the mask layer to form a contact layer;
   arranging an overlay on top of the contact layer;
   inspecting the alignment of the contact layer with the overlay;
   determining an amount of overlay error by measuring a misalignment between two adjacent layers and wherein the two adjacent layers are the contact layer and the overlay;
   determining a rework threshold from the overlay error;
   calculating an overlay correction by measuring the misalignment along at least one of a longitudinal axis of the wafer, a lateral axis of the wafer, and a diagonal axis of the wafer; and
   adjusting at least one subsequent process based on the overlay error and the overlay correction.

10. The process of claim 9, wherein the at least one subsequent process is lithography.

* * * * *